United States Patent [19]

Drimer et al.

[11] Patent Number: 5,257,926
[45] Date of Patent: Nov. 2, 1993

[54] FAST, SAFE, PYROGENIC EXTERNAL TORCH ASSEMBLY

[76] Inventors: Gideon Drimer, 55-2, Even Shmuel, Jerusalem, Israel, 97230; Arie Glaser, 91 Nof Harim, Mevaseret-Zion, Israel, 90805; David M. Rowell, 15 Pond St., Billerica, Mass. 01821

[21] Appl. No.: 809,725

[22] Filed: Dec. 17, 1991

[51] Int. Cl.$^5$ .................................... F23Q 7/06
[52] U.S. Cl. ................................... 431/154; 431/158; 431/160; 431/258; 431/347
[58] Field of Search ............... 431/207, 208, 158, 154, 431/353, 258, 347, 160, 350, 351; 60/39.821, 39.828; 123/145 A, 143 B, 297

[56] References Cited

U.S. PATENT DOCUMENTS

| | | | |
|---|---|---|---|
| 976,221 | 11/1910 | Scrimgeour | 60/39.828 X |
| 1,755,846 | 4/1930 | Steed | 60/39.828 X |
| 3,386,475 | 6/1968 | Horton et al. | 431/158 |
| 3,473,879 | 10/1969 | Berberich | 431/258 X |
| 3,488,130 | 1/1970 | Holme | 431/158 X |
| 3,574,501 | 4/1971 | Mitts | 431/258 |
| 3,738,792 | 6/1973 | Feng | 431/158 |
| 3,861,371 | 1/1975 | Gamell | 123/143 B |
| 4,047,880 | 9/1977 | Caldarelli | 431/208 |
| 4,116,388 | 9/1978 | Trozzi | 239/406 |
| 4,342,551 | 8/1982 | Browning | 431/158 X |
| 4,473,348 | 9/1984 | Tikhonovich et al. | 431/158 X |
| 4,726,336 | 2/1988 | Hoppie et al. | 123/143 B X |
| 4,899,538 | 2/1990 | Shekleton | 431/158 X |
| 4,916,904 | 4/1990 | Ramsaier et al. | 431/158 X |
| 5,055,032 | 10/1991 | Altemark et al. | 431/158 |
| 5,149,261 | 9/1992 | Suwa et al. | 431/350 X |

FOREIGN PATENT DOCUMENTS

| | | | |
|---|---|---|---|
| 0051236 | 4/1980 | Japan | 431/258 |
| 0635361 | 11/1978 | U.S.S.R. | 431/351 |
| 0787801 | 12/1980 | U.S.S.R. | 431/351 |
| 1043421 | 9/1983 | U.S.S.R. | 431/350 |
| 104881 | 5/1986 | U.S.S.R. | 123/145 A |
| 11431172 | 2/1969 | United Kingdom | 431/350 |

*Primary Examiner*—Carl D. Price
*Attorney, Agent, or Firm*—Weingarten, Schurgin, Gagnebin & Hayes

[57] ABSTRACT

A fast, safe pyrogenic external torch assembly that provides pure steam for semiconductor processing in semiconductor processing furnaces includes a gas injection nozzle subassembly, a pulse heater subassembly and a compressed-air-cooled heat-exchanging jacket subassembly. The gas injection nozzle subassembly includes plural oxygen gas injection nozzles and a hydrogen gas injection nozzle that cooperate to provide a torch that is well-behaved over the practicable range of oxygen and hydrogen gas supply rates and ratios, that may be quickly ramped to any desired gas flow conditions and that is free from the possibility of unwanted explosion due to incomplete hydrogen gas consumption. The pulse heater subassembly includes one or more blackbodies and a radiant energy source that are cooperative to quickly and efficiently provide one or more hot spots at the industry safe-ignition temperature. The compressed-air-cooled heat-exchanging jacket subassembly includes a double-walled jacket member through which a low-velocity, high-temperature and high-mass stream of compressed air is moved. The assembly of the invention is readily integrable with existing semiconductor processing furnaces, and enables quick subassembly and assembly placement and replacement during installation and maintenance.

15 Claims, 6 Drawing Sheets

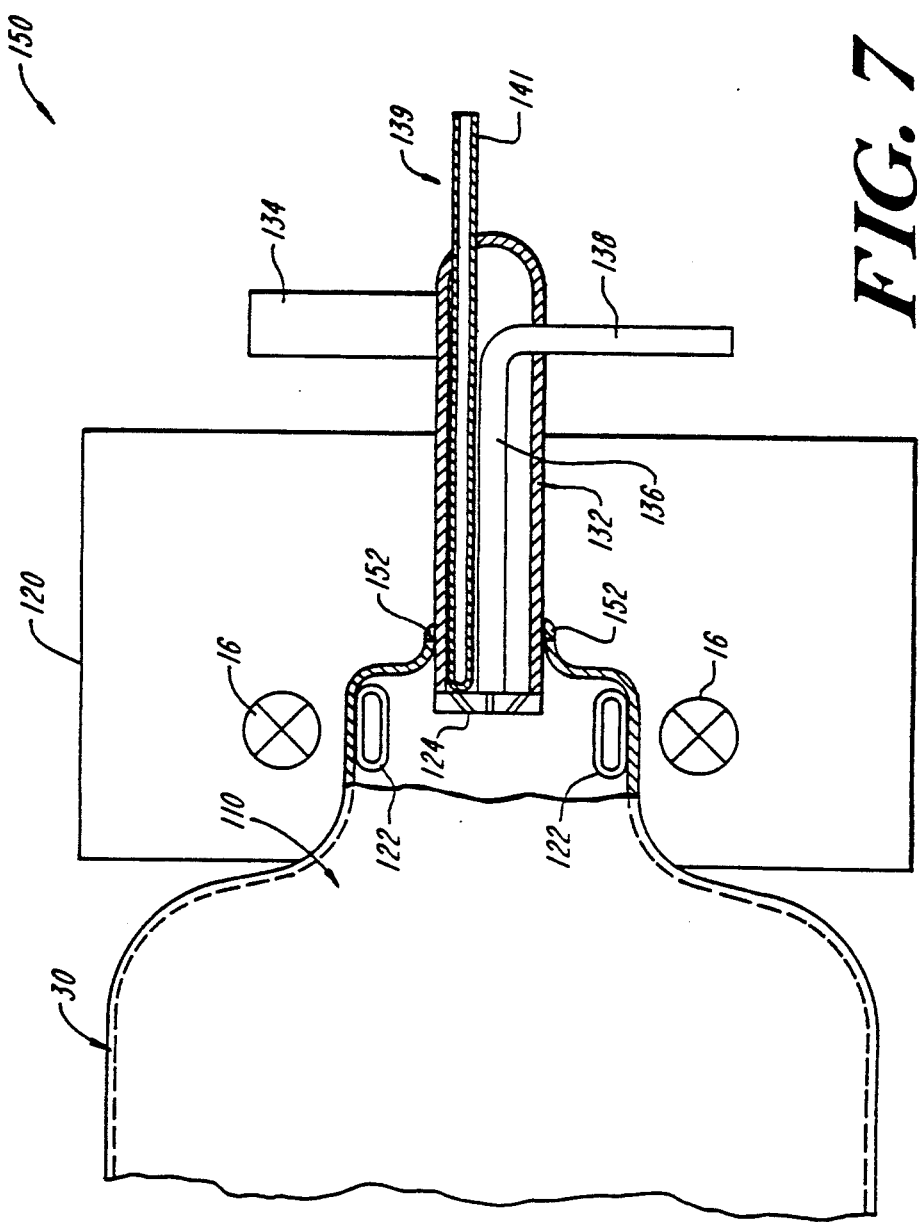

FAST, SAFE, PYROGENIC EXTERNAL TORCH ASSEMBLY

FIELD OF THE INVENTION

The present invention relates to ignition of hydrogen with oxygen by applying a heating pulse from outside a hydrogen/oxygen quartz injector, and, among other things, to a quartz gas injector configuration which maintains small flame contours at high gas flows.

BACKGROUND OF THE INVENTION

The semiconductor industry uses clean steam for fast silicon oxidation processes. The common process name is "wet oxidation", which is itself subdivided into "field oxidation" (where the thickness of the oxide is greater than one-thousand (1000) Å), and "gate oxidation" (<one-thousand (1000) Å). The clean steam is produced by burning extra-clean hydrogen with extra-clean oxygen in a so-called pyrogenic torch unit.

The usual and safe way to generate pyrogenic steam is by direct injection of hydrogen ($H_2$) and oxygen ($O_2$) to the hot (970° C.) oxidation process tube in such a way that the $H_2$ ignition in the $O_2$ environment as well as the torch are inside the process tube. This type of system is know by the name "Pyrogenic Internal Torch" (PIT). The main problem experienced in the PIT-type systems is the difficulty in controlling the fluctuation of the oxide thickness due to the temperature imbalance caused by the hydrogen flame. One typically tight specification for oxide thickness uniformity requires a $+/-0.5°$ C. temperature stabilization. This stabilization is strongly interfered at the source zone of the process tube where the torch is situated. Practicably, the silicon wafer load size must be reduced in order to control thickness uniformity, and lessened production capacity has been the result. Additionally, reduced "thermal budgets" for circuits and operation of chambers at less than safe-ignition temperatures for hydrogen have increased demand for $H_2$ combustion outside the process chamber.

To overcome the problems that are related to the internal heat source, so-called "Pyrogenic External Torch" (PET) systems were developed. The heretofore known PET systems have been constituted by an external, purely-thermal (resistive) ignition element, an $H_2/O_2$ quartz injector, a quartz torch chamber, a water-cooled jacket to provide heat transport for the quartz torch chamber, a safety shield and an electronic controller for safety interlocks and operation communications with a main computer controller. The existing PET systems suffer from some major problems including complex seals and feed lines for the water-cooled heat transfer jacket, the requirement for a continuously preheated ignition element (at and above about 760° C.), a long rise time of the heat-up temperature to safe-ignition point by means of the thermal (resistive) ignition element, large flame contours, which demand correspondingly large quartz vessels, a long rise-time to allow such controlled ramping from gas flows at initial torch request to gas flows at practicable gas flow rates as both to prevent flame blow-out and to ensure explosion-free, complete $H_2$ consumption, and, among others, quartz injector tip erosion due to flame creep-back.

SUMMARY OF THE INVENTION

In accord with one object of the fast, safe, pyrogenic external torch assembly of the present invention, a gas injector subassembly is disclosed that provides a well-behaved flame over the range of practicable $H_2/O_2$ flow rates that is neither subject to flame creepback nor to flame blow-out and that achieves complete $H_2$ combustion. By being free of flame creep-back, the gas injector subassembly of the invention does not degrade, either by devitrification or by recrystallization, providing thereby for its long-life operation. By being free from flame blow-out, the gas injector subassembly of the invention enables to provide quick ramping to any flow rates that may be selected to satisfy the requirements of a particular application. And because the gas injector subassembly of the invention is such that the hydrogen is always completely combusted, the gas injector subassembly completely avoids any possibility of unintended explosion due to $H_2$ build-up.

The disclosed gas injector subassembly of the fast, safe, pyrogenic external torch assembly of the invention includes a hydrogen gas injection nozzle means for ejecting hydrogen along a linear path at a velocity sufficient to prevent flame creep-back, and plural oxygen gas injection nozzle means cooperative with the hydrogen gas injection nozzle means for ejecting oxygen along respective linear paths that intersect the hydrogen gas stream in such a way that corresponding ones of the oxygen gas linear flow paths severally intersect the hydrogen gas flow path at a preselected acute angle thereto and at a point therealong downstream of the hydrogen gas injection nozzle means. The intersecting oxygen gas ejection streams and hydrogen gas ejection stream provide a flame-pencil at comparatively-low gas velocities and a flame-bush at comparatively-high gas velocities, both of which are well-behaved flames that enable to provide comparatively smaller combustion flasks than heretofore thought possible, both with respect to the diameter thereof as well as the length thereof, facilitating the integrability of the fast, safe, pyrogenic external torch assembly of the invention with semiconductor processing furnaces.

In one embodiment of the gas injector subassembly of the fast, safe, pyrogenic external torch assembly of the invention, the oxygen gas injection nozzle means is constituted by circumferentially symmetrically disposed holes provided through an annular face of a conically-shaped quartz $O_2$ gas feed member and the hydrogen gas injection nozzle means is constituted as a hole through a wall enclosed by the annular face of the conically-shaped quartz $O_2$ gas feed member and coaxial therewith that is in communication with an annular hydrogen gas feed member. In one embodiment, the hydrogen gas feed member is dimensioned to receive a heating element coaxially therewithin, which provides preheating of the $H_2$ gas. The dimension of the aperture in the wall of the hydrogen gas injection nozzle is preferably selected to be between eight-tenths (0.8) and one and onetenth (1.1) millimeters in diameter in order to provide a $H_2$ gas escape velocity that avoids flame creep-back at comparatively-low flow-rates, and the holes in the face of the oxygen gas injecting nozzle means are selected to be from eight-tenths (0.8) to one and one-tenth (1.1) mm in diameter, and are preferably selected to be three (3) to five (5) in number. The angle of the conically-shaped oxygen gas feed member is preferably selected to be between fifteen (15) and fifty (50) degrees to the long axis of the gas injector subassembly in order to effect that the plural $O_2$ gas streams from the multiple holes acutely intersect the $H_2$ gas stream downstream of the $H_2$ gas aperture.

In another embodiment of the gas injector subassembly of the fast, safe, pyrogenic external torch assembly in accord with the present invention, the holes of the oxygen gas injection nozzle means and the hole of the hydrogen gas injection nozzle means are respectively provided circumferentially symmetrically and coaxially in a nozzle faceplate that is thermally welded to two concentric cylinders that provide an annular gas feed passageway to the holes of the oxygen gas injection nozzle and a cylindrical gas feed passageway to the aperture of the hydrogen gas injection nozzle. A thermocouple well is provided that lies in parallel relation to the axes of the cylinders. The walls defining the holes of the oxygen gas injection nozzle are angled at an angle selected from a range of angles that provide that the linearly flowing oxygen streams thereout severally intersect the hydrogen gas stream at acute angles thereto corresponding to the angle of the holes and at a point therealong defined downstream of the hydrogen gas injection nozzle. In one embodiment, the gas injector subassembly is removably coupled to the combustion flask and in another embodiment it is integrally attached to the combustion flask.

In accord with another object of the fast, safe, pyrogenic external torch assembly of the present invention, a pulse heater subassembly is disclosed that provides fast ignition of the hydrogen and oxygen gas streams while complying with industry safe-ignition standards. In accord therewith, one or more blackbodies providing point sources close to the one or more hydrogen-/oxygen intersection points in the ignition zone, and one or more lamps, such as quartz halogen lamps with tungsten filaments, positioned in spaced-apart relation to the one or more blackbodies providing point sources, cooperate to provide fast, safe ignition of the $H_2/O_2$ gases. At the initiation of a torch request, the one or more lamps are activated and the tungsten filaments thereof radiate energy that is absorbed by the one or more blackbodies. The temperature of the blackbodies quickly rises, in an exemplary time interval of less than about one (1) minute, to the seven hundred and sixty degrees Centigrade (760° C.) temperature set by industry as a safe, self-ignition point. In some embodiments, two (2) blackbodies providing point sources are employed while in other embodiments a single blackbody providing a point source is employed. For each of the embodiments, the pulse heater subassembly of the invention enables to provide a reduction of the time it takes from torch request to torch operating at maximum gas flow rates by at least a factor of about ten (10) to twenty (20) over that of the heretofore known thermally-heated PET systems.

In accord with a further object of the fast, safe, pyrogenic external torch assembly of the present invention, a compressed-air-cooled jacket subassembly is disclosed that provides simple service connections and small line sizes while it efficiently removes heat produced by the torch in the combustion flask. The disclosed jacket includes an annulus having one, partially open end face through which the mouth of the combustion flask extends and an open end that receives the combustion flask. Compressed air at high-pressure is moved from an air input port through the heat exchanger jacket to an air exhaust port, providing heat transport for the combustion flask, thereby eliminating the need for a water jacket with all of its attendant disadvantages.

BRIEF DESCRIPTION OF THE DRAWINGS

These and other objects and attendant features and advantages of the present invention will become apparent as it becomes better understood by referring to the following detailed description of the presently preferred embodiments thereof, and to the drawings, wherein:

FIG. 7 illustrates a pictorial diagram of another embodiment of the gas injector subassembly as well as another embodiment of the pulse heater subassembly of the fast, safe, pyrogenic external torch assembly in accord with the present invention.

DETAILED DESCRIPTION OF THE PREFERRED EMBODIMENTS

Figure 1:
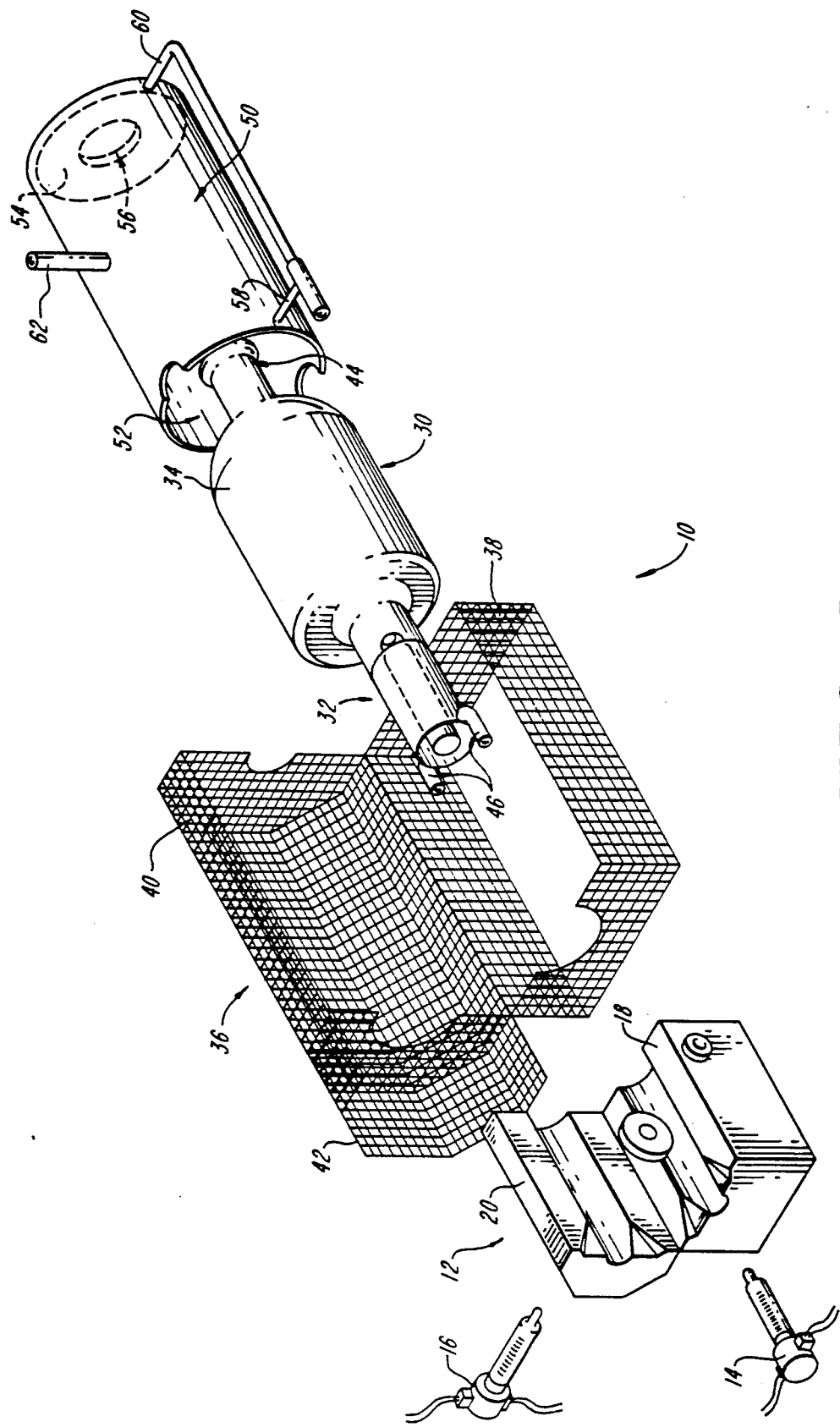
FIG. 1 is an exploded perspective view illustrating the fast, safe, pyrogenic external torch assembly in accord with the present invention.

Referring now to FIG. 1, generally designated at 10 is an exploded perspective view of one embodiment of the novel, fast, safe, pyrogenic external torch assembly in accord with the present invention. The assembly 10 includes a radiant heater and preheater subassembly generally designated 12 that includes first and second radiant energy sources 14, 16, preferably quartz-halogen lamps having tungsten filaments, that are slidably mounted to a housing body 18 to which cover member 20 is pivotally attached. The lamp 14 is slidably received by housing body 18 such that the tungsten filament thereof projects along the longitudinal axis of the housing body 18 and is supported thereby in cantilevered fashion. The lamp 14 provides preheating of the hydrogen gas stream in a manner to be described. The lamp 16 is slidably received by the housing body 18 such that its tungsten filament projects transversely in cantilevered fashion. The radiant energy emitted thereby couples to blackbody radiant-energy-absorbing members to be described in such a way that the temperature of the blackbodies rises to the safe self-ignition temperature (760° C.) of the hydrogen and oxygen streams in compliance with industry safety standards.

A refractory vessel generally designated 30 having a gas injector subassembly generally designated 32 to be described and a combustion flask 34 formed with the injector 32 is received in a perforated heat shield and mechanical guard subassembly generally designated 36 in such a way that the gas injector 32 is in coaxially surrounding relation with the lamp 14 within the radiant heater subassembly 12 when the combustion flask 34 is within the perforated heat shield and mechanical guard subassembly 36. The radiant heater subassembly 12 and the perforated heat shield and mechanical guard subassembly 36 are mounted in longitudinally abutting relation by a Z-adjustable pedestal, not shown, that receives the two subassemblies from the bottoms thereof.

The perforated heat shield and mechanical guard subassembly 36 includes a housing body 38 to which a cover 40 is pivotally attached. The cover 40 has a flange 42 that extends longitudinally out beyond the housing body 38 on the proximate end thereof in order to provide heat shielding and mechanical guarding for the distal end of the radiant heater subassembly 12. The combustion flask 34 has an open mouth generally designated 44 on its distal end through which an extremely-pure steam produced by the combustion of the hydrogen and oxygen in a manner to be described exits to a semiconductor processing furnace, not shown. The refractory vessel 30 is preferably of integral construction, which enables ease of initial set-up and replacement. Oxygen and hydrogen refractory couplings 46 are provided on the proximate end of the gas injector 32 of the refractory vessel 30 to which hydrogen and oxygen gas supply lines, not shown, are removably connected. The refractory vessel 30 is preferably fashioned of quartz.

A compressed-air cooling jacket subassembly generally designated 50 is provided in concentrically surrounding relation with the refractory member 30 within the perforated heat shield and mechanical guard subassembly 36. The compressed-air cooling jacket subassembly 50 is preferably fabricated of a double-walled metal, such as stainless steel, that provides an annular plenum that circumferentially surrounds the refractory member 30 longitudinally along the length of the combustion flask 34 thereof. The proximate end thereof generally designated 52 is open, so as to be slidably receivable over the combustion flask 34 of the refractory member 30, and the distal end thereof is provided with an annular wall 54 having an opening generally designated 56 centrally disposed therethrough that is dimensioned to slidably receive the mouth 44 of the combustion flask 30. Interconnection couplings 58, 60 are provided respectively at distal and proximate ends of the jacket 50 that are in communication with the annular plenum defined by the double-walled jacket 50 to which a source of compressed air, not shown, is removably connected. A coupling 62 is connected to the annular plenum defined by the double-walled cooling jacket 50 at a point intermediate the ends of the jacket 50 to which an air exhaust conduit, not shown, is removably connected. The source of compressed air provides a high-pressure and high-mass heat exchange medium. By way of example, but not by way of limitation, compressed air at a pressure of about fifty (50) pounds per square inch and at a velocity of about four (4) cubic feet per minute has been found to rise to a temperature of between three hundred (300) and four hundred (400) degrees Centigrade as it efficiently removes the heat generated by the pyrogenic torch. The high-pressure and high-temperature air provides a comparatively-large mass that dwells sufficiently long in the annular plenum of the jacket subassembly 50 to pick up the heat generated off the combustion flask. Simple, flexible (e.g., rubber) compressed-air feed lines may be provided to the couplings 58, 60, 62, and initial placement and replacement of the jacket 50 is able to be effected quickly, simply by the steps of opening the cover 42 of the perforated heat shield and mechanical guard subassembly 36, then lifting the jacket 50, and therewith the combustion flask 30, and by slidably removing the jacket 50 therefrom and replacinq it again with another jacket 50, which sequence of steps typically requires no more than about two (2) minutes to effect.

Figure 2:
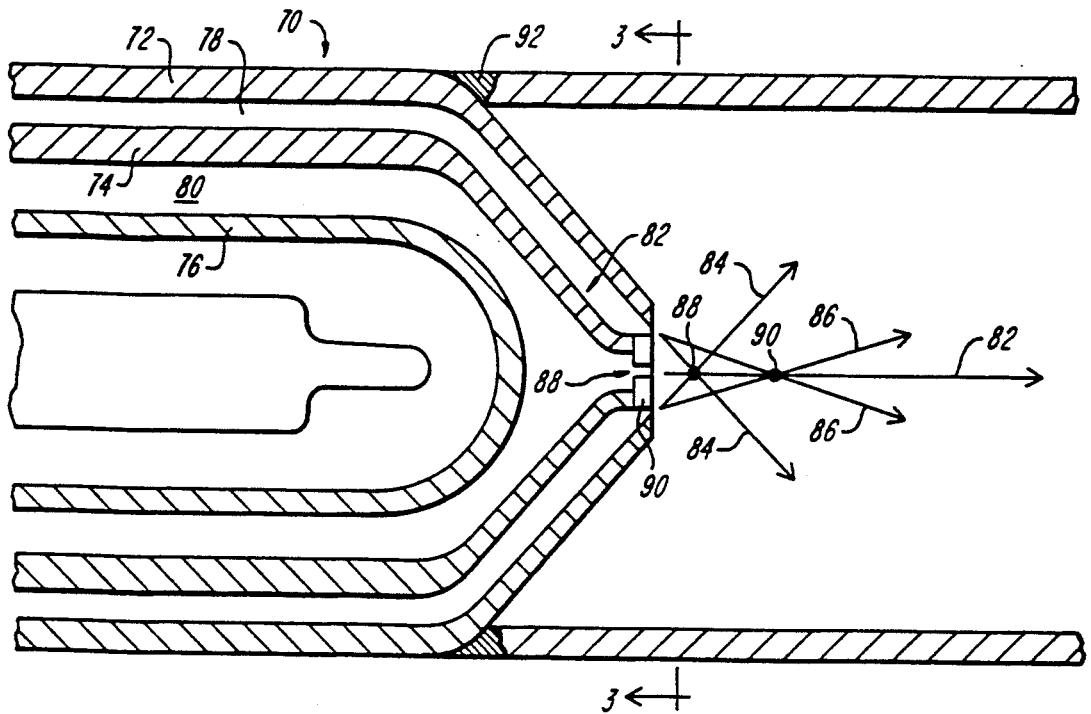
FIG. 2 is a sectional view illustrating the gas injector subassembly of the fast, safe, pyrogenic external torch assembly in accord with the present invention.
Figure 3:
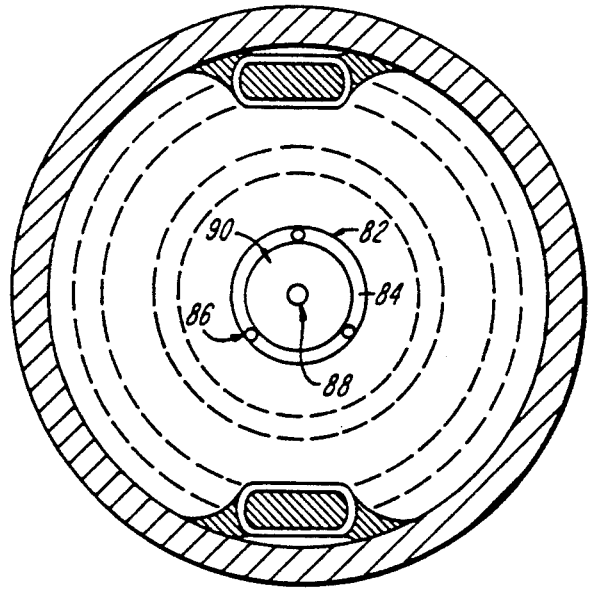
FIG. 3 is a sectional view along the lines 3—3 of FIG. 2.

Referring now to FIG. 2, generally designated at 70 is a longitudinal section through the gas injector subassembly 32 (FIG. 1) of the refractory member 30 (FIG. The gas injector 70 is constituted by three coaxial annular walls 72, 74, 76 in such spaced-apart relation as to provide an annular oxygen flow passageway generally designated 78 between the walls 72, 74 and an annular hydrogen flow passageway generally designated 80 between the walls 74 and 76. The annular walls 72, 74 conically taper, preferably at an angle of between forty-five (45) to sixty (60) degrees to the long axis of the injector 70, to provide a conically-shaped oxygen gas injection nozzle having an annular injection orifice generally designated 82 as best seen in FIG. 3. The orifice of the nozzle 82 is restricted, in one embodiment by quartz plates 84 thermally welded thereto, to provide plural oxygen gas injection holes generally designated 86, preferably circumferentially disposed symmetrically about the nozzle 82. In another embodiment, the plural oxygen gas injection holes 86 are formed by the steps of 1.) fusing the ends of the conically-tapering annular walls 72, 74 by heating the same, 2.) cutting the fused ends to provide a flat end-face without penetrating to the annular injection orifice, and 3.) forming the holes therethrough that define the oxygen gas holes by mechanical or laser drilling or by other means. In the illustrated embodiment, three (3) such oxygen gas injection holes 86 that each subtend about sixty (60) degrees of arc are provided.

A hydrogen gas injection nozzle generally designated 88 is provided that is concentric with the oxygen gas injection nozzle 82 and coaxial with the longitudinal axis of the gas injector 70 as best seen in FIG. 3. The hydrogen gas injection nozzle 88 is provided in one embodiment by refractory plate member 90 having a central aperture therethrough that is thermally welded to the free end of the annular wall 74. In the embodiment where the oxygen gas holes are formed by the above-named steps, the hydrogen gas nozzle is formed by the same steps, together with the step of drilling, as by laser or by mechanical means, through the flat end-face formed by the fusing step. Other methods for forming the $O_2$ and $H_2$ injecting nozzles will become apparent to those skilled in the art. While holes of circular cross-section are presently preferred, the invention is operable with holes of many different geometries.

As the hydrogen gas is ejected from the gas injection nozzle 88, it flows along a linear path schematically illustrated by an arrow 82. Likewise, as the oxygen gas is ejected by corresponding ones of the oxygen gas injection holes 86, the oxygen gas flows along corresponding linear flow paths schematically illustrated by arrows 84, 86. The arrows 84, 86 respectively correspond to comparatively-slower and comparatively-faster oxygen gas velocities. Over the practicable range of gas velocities, the oxygen gas streams intersect the hydrogen gas stream downstream of the hydrogen gas injection nozzle 88 at respective acute angles thereto that correspond to the angle of taper of the conically-tapered end walls of the annuli 72, 74.

It has been found that the torch provided by the nozzle 70 is well-behaved over the practicable range of oxygen to hydrogen gas ratios, typically one-to-one (1:1) and one-to-two (1:2), and over the practicable range of oxygen and hydrogen gas flows, typically one (1) to twenty (20) SLM for the oxygen gas flow and typically one (1) to forty (40) SLM for the hydrogen gas flow.

Figure 4:
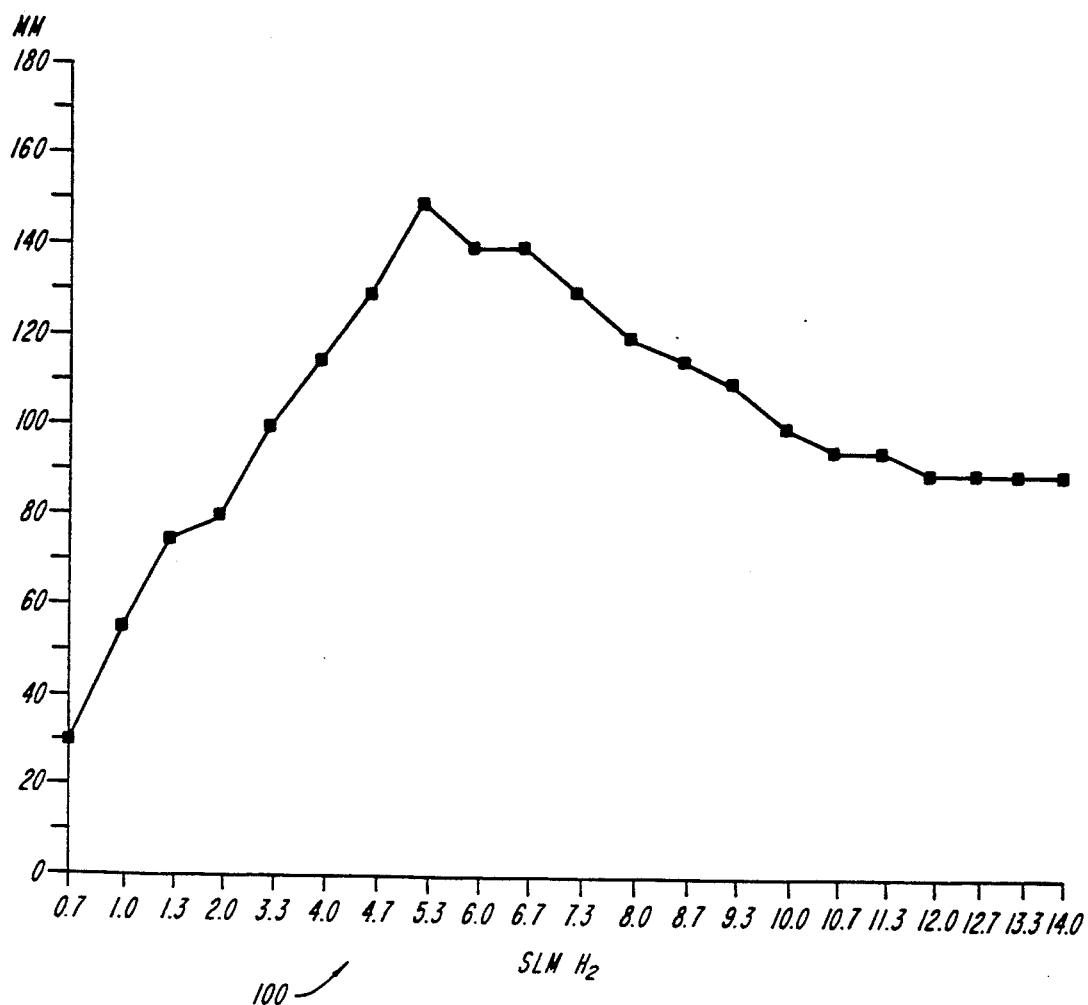
FIG. 4 is a graph useful in illustrating the manner of operation of the fast, safe, pyrogenic external torch assembly in accord with the present invention.

The behavior of the flame is illustrated by a graph generally designated at 100 in FIG. 4, plotted for an exemplary hydrogen to oxygen ratio of one and nine-tenths to one (1.9:1), oxygen gas injection hole dimensions of eight-tenths (0.8) mm, and a hydrogen gas injection aperture of nine-tenths (0.9) mm. The ordinate is flame length in millimeters and the abscissa is flow of hydrogen gas in Standard Liters per Minute (SLM). For operation at comparatively-low flow velocities, the torch appears as a flame-pencil, not illustrated, having a length that corresponds to the value of the ordinate and a uniform diameter, approximately ten (10) mm. As the flow rate increases beyond about five and three-tenths (5.3) SLM, the torch changes in shape from a flame-pencil to a flame-bush, not shown, that is smaller in diameter at its proximate end, approximately two to four (2-4) mm, and larger at its distal end, approximately fifty to eighty (50-80) mm. The change in the shape of the torch from the flame-pencil to the flame-bush, which occurs approximately at the five and three-tenths (5.3) SLM flow rate in the graph 100 of FIG. 4, and which occurs at different flow rates and correspondingly different flame lengths for different ratios of the hydrogen to the oxygen mixture over the range of practicable mixtures, not illustrated, is believed to result from the formation by the oxygen gas streams of a turbulent barrier cutting across the hydrogen gas stream.

Over the range of hydrogen to oxygen ratios and flow rates, the velocity with which the hydrogen is ejected by the hydrogen gas injection nozzle is fast enough to prevent burn-back, a phenomenon whereby the flame "creeps-back" to the tip of the nozzle 70 (FIG. 2) tending to melt or otherwise degrade the same. It has been found that hydrogen gas injection nozzle diameters over the range of about eight-tenths (0.8) to one and one-tenth (1.1) millimeters provide a sufficiently high escape velocity, on the order of one-thousand (1000) feet per second, that, even at the lower end of the practicable range of velocities of oxygen and hydrogen gas flow rates, enables to always keep the flame distanced from the nozzle by about one-half (0.5) to one and one-half (1.5) millimeters.

For any set of gas flow rates and mixtures of practicable interest, it has been found that the gas injector subassembly 32 of the fast, safe, pyrogenic external torch assembly in accord with the present invention always results in the complete consumption of all of the $H_2$, whereby any danger of unintended explosion is excluded.

Besides preserving the nozzle from burn-back and eliminating altogether the possibility of unintended explosion due to but partial hydrogen consumption, the well-behaved flame of the gas injector of the fast, safe, pyrogenic external torch assembly of the invention makes possible both the provision of comparatively smaller-dimensioned combustion flasks than heretofore possible and the separation of the ignition zone from the combustion flask. By way of comparison, a typical prior art combustion flask measured eighteen (18) inches in length, while the combustion flask 34 of the instant invention measures twelve (12) inches in length, and the prior art flask measured seven (7) inches in diameter while that of the instant invention measures three and seven-tenths (3.7) inches in diameter. The smaller dimensions and ignition zone/combustion zone separation made possible by the well-behaved flame of the instant invention enable more compact and more easily integratable and maintainable torch assemblies then heretofore possible.

The gas injector 32 (FIG. 1) and the combustion flask 34 of the refractory member 30 are thermally welded together as by annular tack 92 (FIG. 2) to provide a one-piece construction. Such a gas injector and combustion flask construction enables to provide quick assembly and disassembly, simply by lifting the same into and out of the perforated heat shield and mechanical guard subassembly 36, once the radiant heating elements 14, 16 (FIG. 1) have been slidably removed from the radiant heater subassembly 12 and its pivotal cover 20 opened, and once the compressed-air cooling jacket 50 (FIG. 1) is slidably removed form therearound. By way of example, it may take about two (2) minutes to change the refractory member of the fast, safe, external pyrogenic torch assembly of the present invention rather than the twenty (20) minutes or so typical of the heretofore known PET systems. A further advantage is the one-piece injector and combustion flask member completely eliminates any problems associated with seal-leakage that have been associated with the heretofore known PET systems.

Figure 5A:
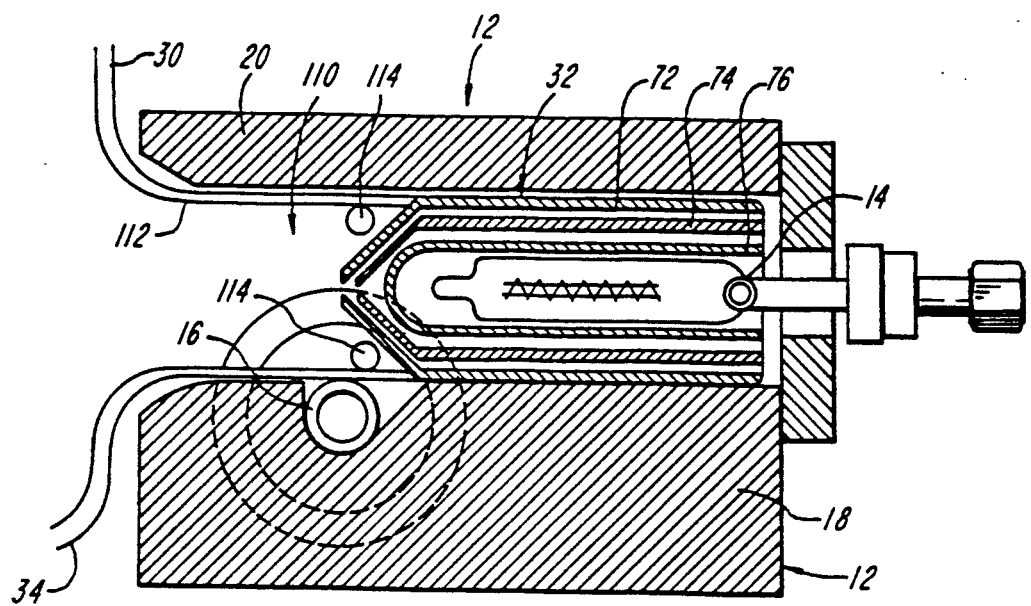
FIG. 5 illustrates as FIG. 5A a longitudinal section and illustrates as FIG. 5B a partially-sectional partially-plan view of the pulse heater subassembly of the fast, safe, pyrogenic external torch assembly in accord with the present invention.
Figure 5B:
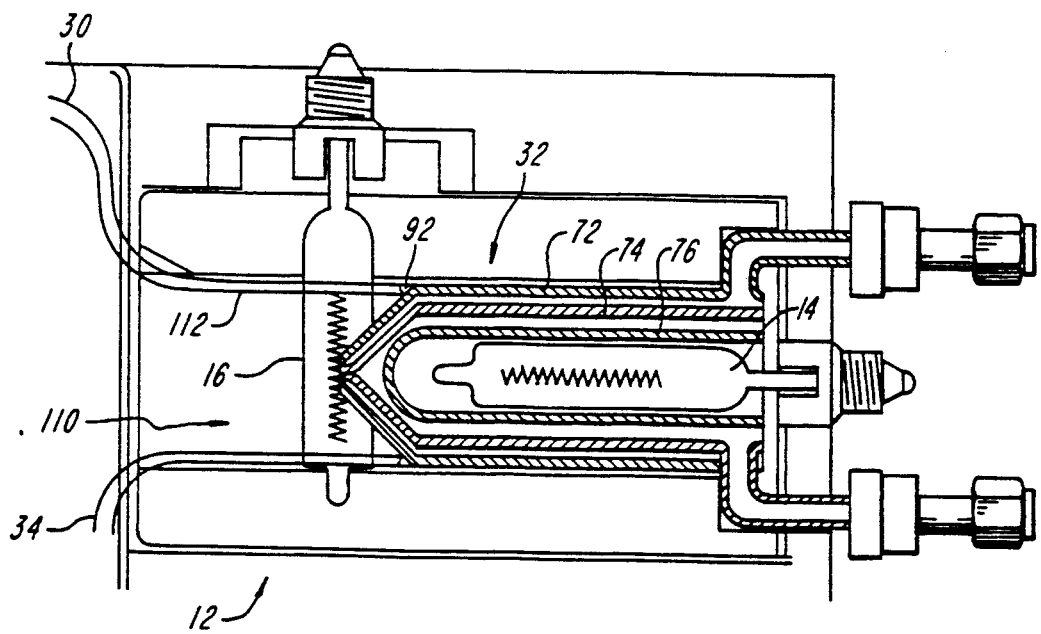

As shown in FIGS. 5A and 5B, the longitudinally extending lamp 14, the transversely extending lamp 16 and the refractory member 30 are slidably received in the radiant heater and preheating subassembly 12 in such a way that the longitudinal extending lamp 14 is axially symmetrically within the gas injector 32, an the transversely extending lamp 16 is in such position that energy radiantly emitted therefrom traverses an ignition region generally designated 110, adjacent the combustion flask 34, whereat the hydrogen and the oxygen are ignited at the industry safe-ignition point. The combustion flask 34 necks-down to a cylindrical body part 112 to which the gas injector 32 is integrally attached by the annular thermal weld 92 (FIG. 2).

The transversely extending lamp 16 is so positioned in the body 18 that the energy emitted therefrom, that traverses the ignition region 110, is absorbed by one or more blackbodies 114 that are thermally welded to the cylindrical body member 112 of the combustion flask 34 in position to ignite the hydrogen and oxygen streams controllably ejected by the gas injector 32. The blackbodies 114 absorb the radiant energy emitted by the transversely extending lamp 16 and re-radiate it as hot point-sources at the safe self-ignition temperature.

The blackbodies 114 preferably consist of evacuated, quartz-encapsulated, granular-silicon-carbide subassemblies that are thermally welded to the cylindrical member 112. Any suitable blackbody material capable of absorbing radiant energy, that does not degrade with increasing temperature, and that is semiconductor "clean", such as Boron carbide ($B_4C$), titanium Boride ($TiB_2$) and Carbon (C), may be employed without departing from the inventive concept.

While radiant energy coupling to the blackbodies 114 is the principal vehicle of energy transfer, it is believed that there is also some thermal coupling therebetween. While two blackbodies 114 are illustrated, a different number, such as a single blackbody, could be employed as well without departing from the inventive concept.

The radiant energy emitted by the transversely extending lamp 16 is absorbed by the blackbodies 114 and is re-radiated therefrom as point-sources of heat at and above the safe ignition point (760° C.) in compliance with industry safety standards. The radiant (and thermal) energy coupling between the transversely extending lamp 16 and the blackbodies 114 provide high-speed ramping of the temperature of the blackbodies 114 up to the safe, self-ignition point. In the exemplary embodiment, after initial torch request, it takes about forty-five (45) seconds to get up to the safe, self-ignition temperature at the blackbody point sources. Whereupon, the hydrogen and the oxygen are caused to flow at the turn-on rate, the longitudinally extending lamp 14 preheats the hydrogen that longitudinally flows therearound in the annular fluid flow passageway defined between the annular members 74, 76 and out the injection nozzle 88 thereof, and the $H_2$ and $O_2$ are ignited by the blackbody point sources downstream of the gas injector 30 in the ignition region 110 of the refractory member 30. Thereafter, after about another fifteen (15) seconds in the exemplary embodiment, the $H_2$ and $O_2$ gases are ramped from the turn-on conditions up to the desired flow rates. By way of comparison, a typical prior art PET system would require about twenty (20) minutes to get to the safe, self-ignition temperature and about another five (5) minutes in order to ramp up from the turn-on gas flow conditions to the desired flow rate.

The improvement in speed made possible by the instant invention is a result of the highly-efficient radiant coupling of energy to the point-source blackbodies, that quickly and efficiently heat up to the safe self-ignition temperature, and of the well-behaved nature of the torch produced by the gas injector. Since the torch is completely stable, it has no tendency to push away from the gas injector nozzle, and does not blow-out as the gases are quickly ramped from the turn-on flow rates to the desired flow rates, and because the hydrogen is always completely combusted at any given flow rates and rate of change of flow rates, ramping from the turn-on flow rates to the desired flow rates is able to be as quick as desirable without chancing an unintended explosion, unlike the heretofore known PET systems that quite typically required "babying" to avoid explosions.

Figure 6B:
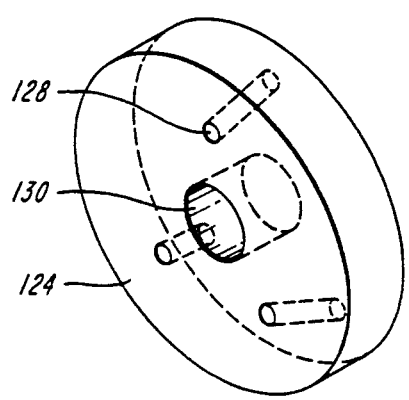
FIG. 6 illustrates as FIG. 6A a pictorial diagram of another embodiment of the gas injector subassembly as well as another embodiment of the pulse heater subassembly and illustrates as FIG. 6B a plan view of the faceplate of the alternative embodiment of the gas injector subassembly of the fast, safe, pyrogenic external torch assembly in accord with the present invention.
Figure 6A:
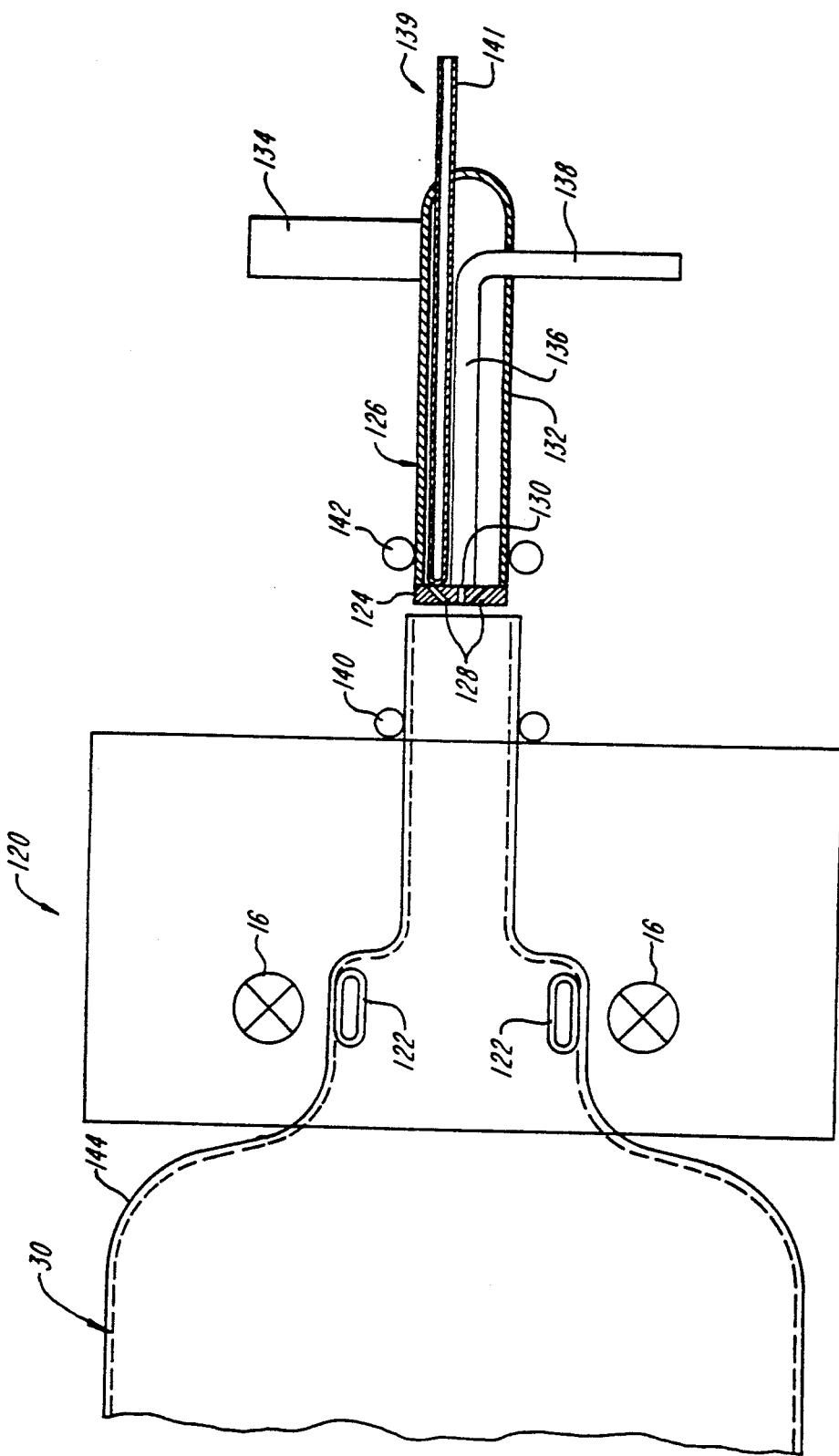

Referring now to FIG. 6, generally designated at 120 is another embodiment of the gas injector subassembly of the fast, safe, pyrogenic external torch assembly in accord with the present invention. The embodiment 120 differs from that already described in four main respects. In the first place, the longitudinally extending lamp and the corresponding function of preheating the hydrogen gas prior to ignition has been eliminated, being replaced with two vertically-oriented lamps 16 and cooperative blackbodies 122 transverse to the injector axis and in the same plane as the front surface of an injector faceplate 124 to be described. In the second place, the gas injector is differently configured in quartzware. The gas injector of the FIG. 6 embodiment includes a faceplate 124 thermally welded to hydrogen and oxygen gas supply member generally designated 126. The faceplate 124 is preferably laser-drilled to provide plural oxygen gas injection holes 128 that are circumferentially symmetrically disposed about a central, coaxial hydrogen gas injection orifice 130 as best seen in FIG. 6B. The walls of the faceplate 126 defining the oxygen gas injection holes 128 preferably are angled at an acute angle selected from the range of angles that includes fifteen (15) degrees to fifty (50) degrees, three such holes each subtending sixty (60) degrees being one presently preferred embodiment as seen in FIG. 6B. The hydrogen gas injection orifice 130 is preferably laser-drilled to provide a diameter selected from the range of diameters that includes eight-tenths (0.8) to one and one-tenth (1.1) millimeters. As in the embodiment described above in connection with the description of FIGS. 1-5, the embodiment 120 of the gas injector of the fast, safe, pyrogenic external torch assembly in accord with the present invention provides a well-behaved flame, shaped, in dependance on the $H_2/O_2$ gas ratio and flow rates, as either a flame-pencil or a flame-bush, over the range of practicable hydrogen to oxygen flow ratios and over the range of practicable hydrogen and oxygen gas flow velocities.

The hydrogen and oxygen gas supply member 126 includes an outer quartz annulus 132 terminating in an integrally formed oxygen gas receiving nipple 134 in surrounding relation with a coaxial quartz cylinder 136 terminating on its end remote from the faceplate 124 in a hydrogen gas receiving nipple 138. The third respect by which the embodiment of 120 differs is in the incorporation of a thermocouple well generally designated 139, positioned longitudinally to the principal axis of the injector assembly. The thermocouple (TC) well is comprised of a tube of refractory material 141 sealed at one end and of sufficient size that a conventional thermocouple may be slidably inserted therein. The TC well penetrates and is welded to the caudal wall of the member 126 extending in near proximity to the faceplate 124. The TC well is radially positioned at a location such that occlusion of the $O_2$ orifices (128 of FIG. 6B) does not occur and is preferably at a radial position halfway between two such orifices. Incorporation of said TC well provides accurate measurement of temperature relating closely to the required ignition temperature on the far side of the faceplate 124.

The fourth respect by which the embodiment 120 differs is in the capability of utilizing cooperative, double seals 140, 142, such as ULTRATORR fittings, a trademark of the Cajon Corporation, that provide leakage-free sealing between doubly-necked-down combustion flask 144 and the gas injector. The neck of smallest diameter is dimensioned to slidably receive the faceplate 124 and integrally attached gas supply member 126, and stops, not shown are provided respectively to locate the doubly-necked-down combustion flask 144 with respect to the transversely extending lamp 16 and to locate the tip of the faceplate of the gas injector 32 in line with the transversely extending lamp 16 and blackbody 122. The operation of the FIG. 6 embodiment achieves the same well-behaved flame and other advantages that the embodiment of the FIGS. 1-5 described above does, which are not separately described again herein for the sake of brevity of explication.

Referring now to FIG. 7, generally designated at 150 is another embodiment of the gas injector subassembly of the fast, safe, pyrogenic external torch assembly in accord with the present invention. The embodiment 150 differs from the embodiment 120 of FIG. 6 in the sole respect that the gas injector is integrally attached by an annular thermal weld 152 to the necked-down portion of the combustion flask. Like the embodiment of FIG. 6 the embodiment of FIG. 7 achieves the same well-behaved flame and other advantages of the instant invention as specified hereabove, and are not repeated again for the sake of brevity of explication.

Many modifications of the presently disclosed invention will become apparent to those skilled in the art having benefited from the disclosure of the instant invention.

What claimed is:

1. A fast, safe pyrogenic external torch assembly, comprising:
   a combustion flask having ends and a long axis that is open on one of its ends to allow the exit of steam and that defines on the other of its ends an ignition zone in which preselected first and second gases are combusted to produce steam;
   a gas injection subassembly coupled in a predetermined manner to the end of the combustion flask defining the ignition zone, said gas injection subassembly having a nozzle through which said first and second preselect gases are ejected into the ignition zone; and
   a radiant energy emitter and a radiant energy absorber subassembly positioned in the ignition zone, the energy absorber operative in response to the radiant energy emitter to provide at least one hotspot to ignite the preselected gases in the ignition zone of the combustion flask.

2. The assembly of claim 1, wherein said combustion flask subassembly and said gas injection subassembly are fabricated of refractory material.

3. The assembly of claim 1, wherein the predetermined manner of coupling is integrally coupled.

4. The assembly of claim 1, wherein the predetermined manner of coupling is removably coupled, and further including means for sealing the removably coupled combustion flask and gas injection subassemblies.

5. The assembly of claim 1, wherein said radiant energy emitter includes at least one lamp and said radiant energy absorber includes at least one blackbody member spaced from the lamp.

6. The assembly of claim 5, wherein said at least one lamp is a quartz-halogen lamp with a tungsten filament and wherein said at least one blackbody member is an evacuated, quartz-encapsulated, granular-silicon-carbide member.

7. A fast, safe pyrogenic external torch assembly, comprising:
   a combustion flask having ends and a long axis that is open on one of its ends to allow the exit of steam and that defines on the other of its ends an ignition zone in which preselected first and second gases are combusted to produce steam; and
   a gas injection subassembly coupled in a predetermined manner to the end of the combustion flask defining the ignition zone, said gas injection subassembly having first nozzle walls defining a first orifice of a first preselected size through which is ejected said first preselected gas along a first liner stream flow path into the ignition zone and the combustion flask and having second nozzle walls defining a set of second orifices through which is ejected said second preselected gas along individual ones of second linear flow paths that intersect the first flow path at at least one corresponding preselected acute angle thereto at at least one point therealong downstream of the first nozzle walls;
   wherein the predetermined manner of coupling is removably coupled, and further including means for sealing the removably coupled combustion flask and gas injection subassemblies.

8. The assembly of claim 7, wherein the sealing means includes at least one seal member between the removably coupled combustion flask and gas injection subassemblies.

9. The assembly of claim 8, wherein said seal member includes an ULTRATORR fitting.

10. A fast, safe pyrogenic external torch assembly, comprising:
    a combustion flask having ends and a long axis that is open on one of its ends to allow the exit of steam and that defines on the other of its ends an ignition zone in which preselected first and second gases are combusted to produce steam; and
    a gas injection subassembly coupled in a predetermined manner to the end of the combustion flask defining the ignition zone, said gas injection subassembly having first nozzle walls defining a first orifice of a first preselected size through which is ejected said first preselected gas along a first liner stream flow path into the ignition zone and the combustion flask and having second nozzle walls defining a set of second orifices through which is ejected said second preselected gas along individual ones of second linear flow paths that intersect the first flow path at at least one corresponding preselected acute angle thereto at at least one point therealong downstream of the first nozzle walls;
    wherein the first nozzle walls of the gas injection subassembly include a plate member defining a plane and having said first orifice therethrough and said second nozzle walls of the gas injection subassembly include first and second spaced-apart conically-shaped walls angled at said preselected acute angles that terminate in an annular orifice defining a contained plane and include third walls obstructing preselected portions of the annular orifice selected to provide said set of second orifices, and wherein normals to the plane of the plate member and to the contained plane defined by the annular orifice are in generally parallel relation; and
    first and second annuli integrally formed with said first and second conically-shaped walls respectively providing an annular feed path for said second preselected gas to said set of second orifices and a cylindrical member concentrically disposed within said first and second annuli and integrally attached to said plate member and providing a cylindrical feed path for said first preselected gas to said first orifice;
    wherein said cylindrical member concentrically disposed within said first and second annuli is dimensioned to slidably receive a lamp member, and further including a lamp member slidably received within said cylindrical member for heating the first preselected gas in the cylindrical feed path.

11. A fast, safe pyrogenic external torch assembly, comprising:
    a combustion flask having ends and a long axis that is open on one of its ends to allow the exit of steam and that defines on the other of its ends an ignition zone in which preselected first and second gases are combusted to produce steam;

a gas injection subassembly coupled in a predetermined manner to the end of the combustion flask defining the ignition zone, said gas injection subassembly having first nozzle walls defining a first orifice of a first preselected size through which is ejected said first preselected gas along a first liner stream flow path into the ignition zone and the combustion flask and having second nozzle walls defining a set of second orifices through which is ejected said second preselected gas along individual ones of second linear flow paths that intersect the first flow path at at least one corresponding preselected acute angle thereto at at least one point therealong downstream of the first nozzle walls;

wherein the first nozzle walls of the gas injection subassembly include a planar member having said first orifice thereinthrough and said second nozzle walls of the gas injection subassembly include first and second space-apart conically-shaped walls angled at said preselected acute angles that terminate in said planar member and having said set of second orifices thereinthrough in position it eh space defined between said first and second spaced-apart conically-shaped walls; and first and second annuli respectively integrally formed with said first and second conically-shaped walls providing an annular feed path for said second preselected gas to said set of second orifices and a cylindrical member concentrically disposed within said first and second annuli and integrally attached to said planar member and providing a cylindrical feed path for said first preselected gas to said first orifice.

12. A fast, safe pyrogenic external torch assembly, comprising:

a combustion flask having ends and a long axis that is open on one of its ends to allow the exit of steam and that defines on the other of its ends an ignition zone in which preselected first and second gases are combusted to produce steam;

a gas injection subassembly coupled in a predetermined manner to the end of the combustion flask defining the ignition zone, said gas injection subassembly having first nozzle walls defining a first orifice of a first preselected size through which is ejected said first preselected gas along a first liner stream flow path into the ignition zone and the combustion flask and having second nozzle walls defining a set of second orifices through which is ejected said second preselected gas along individual ones of second linear flow paths that intersect the first flow path at at least one corresponding preselected acute angle thereto at at least one point therealong downstream of the first nozzle walls;

wherein the gas injection subassembly includes a faceplate and wherein said first nozzle walls of the as injection subassembly extend through said faceplate to provide said first orifice and wherein said second nozzle walls of the gas injection subassembly extend through said faceplate angled at said preselected acute angles to provide said set of second orifices thereinthrough; and a thermocouple well.

13. A fast, safe pyrogenic external torch assembly, comprising:

a combustion flask having ends and a long axis that is open on one of its ends to allow the exit of steam and that defines on the other of its ends an ignition zone in which preselected first and second gases are combusted to produce steam;

a gas injection subassembly coupled in a predetermined manner to the end of the combustion flask defining the ignition zone, said gas injection subassembly having first nozzle walls defining a first orifice of a first preselected size through which is ejected said first preselected gas along a first liner stream flow path into the ignition zone and the combustion flask and having second nozzle walls defining a set of second orifices through which is ejected said second preselected gas along individual ones of second linear flow paths that intersect the first flow path at at least one corresponding preselected acute angle thereto at at least one point therealong downstream of the first nozzle walls; and a radiant energy emitter and a radiant energy absorber subassembly positioned in the ignition zone, the energy absorber operative in response to the radiant energy emitter to provide at least one hotspot to ignite the preselected gases in the ignition zone of the combustion flask.

14. The assembly of claim 13, wherein said radiant energy emitter includes at least one lamp and said radiant energy absorber includes at least one a blackbody member spaced from the lamp.

15. The assembly of claim 13, wherein said at least one lamp is a quartz-halogen lamp with a tungsten filament and wherein said at least one blackbody member is an evacuated, quartz-encapsulated, granular-silicon-carbide member.

* * * * *

UNITED STATES PATENT AND TRADEMARK OFFICE
CERTIFICATE OF CORRECTION

PATENT NO. : 5,257,926

DATED : November 2, 1993

INVENTOR(S) : Gideon Drimer, et al

It is certified that error appears in the above-indentified patent and that said Letters Patent is hereby corrected as shown below:

Column 2, line 58, "onetenth" should read --one-tenth--.

Column 6, line 14, "refractory member 30 (FIG." should read --refractory member 30 (FIG. 1).--

Column 8, line 41, "an the" should read --and the--.

Column 8, line 66, "Boron carbide" should read --Boron Carbide--.

Column 8, line 66, "titanium Boride" should read --Titanium Boride--.

Column 13, line 8, "liner" should read --linear--.

Column 13, line 48, "liner" should read --linear--.

Column 14, line 7, "as injection" should read --gas injection--.

Column 14, line 26 "liner" should read --linear--.

Column 14, line 26, "liner" should read --linear--.

UNITED STATES PATENT AND TRADEMARK OFFICE
CERTIFICATE OF CORRECTION

PATENT NO. : 5,257,926
DATED : November 2, 1993
INVENTOR(S) : Gideon Drimer, et al It is certified that error appears in the above-indentified patent and that said Letters Patent is hereby corrected as shown below:

Column 11, line 62, "liner" should read --linear--.

Signed and Sealed this

Twentieth Day of September, 1994

Attest:

BRUCE LEHMAN

Attesting Officer

Commissioner of Patents and Trademarks